United States Patent
Burda et al.

(10) Patent No.: US 8,315,078 B2
(45) Date of Patent: Nov. 20, 2012

(54) POWER SAVING STATIC-BASED COMPARATOR CIRCUITS AND METHODS AND CONTENT-ADDRESSABLE MEMORY (CAM) CIRCUITS EMPLOYING SAME

(75) Inventors: Gregory Christopher Burda, Raleigh, NC (US); Jason Philip Martzloff, Holly Springs, NC (US); Yeshwant Nagaraj Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 694 days.

(21) Appl. No.: 12/357,767

(22) Filed: Jan. 22, 2009

(65) Prior Publication Data

US 2010/0182816 A1    Jul. 22, 2010

(51) Int. Cl.
*G11C 15/00* (2006.01)
(52) U.S. Cl. ............... 365/49.1; 365/49.17; 365/49.11; 365/49.12; 365/49.13; 365/49.15
(58) Field of Classification Search ...... 365/49.1–49.18, 365/154
See application file for complete search history.

(56) References Cited

U.S. PATENT DOCUMENTS

| | | | | |
|---|---|---|---|---|
| 5,920,515 A * | 7/1999 | Shaik et al. | ............... | 365/200 |
| 6,381,673 B1 * | 4/2002 | Srinivasan et al. | ............ | 711/108 |
| 6,405,307 B1 * | 6/2002 | Murty et al. | .................. | 712/239 |
| 7,016,211 B2 * | 3/2006 | Park et al. | .................. | 365/49.12 |
| 7,382,637 B1 * | 6/2008 | Rathnavelu et al. | ....... | 365/49.17 |
| 2004/0120191 A1 | 6/2004 | Nakase | | |

OTHER PUBLICATIONS

International Search Report and Written Opinion—PCT/US2010/021655-ISA/EPO—Mar. 26, 2010.

\* cited by examiner

*Primary Examiner* — Vu Le
*Assistant Examiner* — Han Yang
(74) *Attorney, Agent, or Firm* — Nicholas J. Pauley; Peter Michael Kamarchik; Jonathan T. Velasco (57) ABSTRACT

Static-based comparators and methods for comparing data are disclosed. The static-based comparator is configured to selectively switch at least one comparator output in response to a comparison of corresponding data with compare data, and a validity indicator for the data. If the validity indicator indicates valid data, the static-based comparator switches to drive the comparator output indicating either a match or mismatch between corresponding compared data. If the validity indicator indicates invalid data, the static-based comparator provides a mismatch on the comparator output without switching the static-based comparator regardless of whether or not the data matches the compare data. In this manner, the static-based comparator does not dissipate power switching the comparator output for data marked invalid. The static-based comparator can be employed in content addressable memories (CAMs) for comparing one or more bits of tag data to corresponding bit(s) of compare data.

15 Claims, 10 Drawing Sheets

| CASE | TAG<0-N, 0-M> (96) | ~TAG<0-N, 0-M> | 110 | 115 |
|---|---|---|---|---|
| 1 | 0 | 1 | 0/1 | 1/0 |
| 2 | 0 | 0 | 0 | 1 |
| 3 | 1 | 1 | 1 | 0 |
| 4 | 1 | 0 | 0/1 | 1/0 |

|  | CAM (130, 144) | CAM (162) |
|---|---|---|
| MEMORY BITCELL (80) | +2 | +0 |
| COMPARATOR CIRCUIT (100) | +2 | +8 |
| TOTAL ADDED TRANSISTORS | +4 | +8 |

POWER SAVING STATIC-BASED COMPARATOR CIRCUITS AND METHODS AND CONTENT-ADDRESSABLE MEMORY (CAM) CIRCUITS EMPLOYING SAME

BACKGROUND

I. Field of the Disclosure

The technology of the disclosure relates generally to comparator circuits and content-addressable memory (CAM) circuits and related systems and methods.

II. Background

Content-addressable memory (CAM) is a type of computer memory particularly suited for use in high-speed searching applications. Unlike standard random access memory (RAM) in which a memory address is supplied and the RAM returns the data word stored at that memory address, CAM implements a look-up table function. The look-up table function determines if supplied compare data is stored in any memory locations in the CAM. If so, either the data word or a list of one or more memory locations in the CAM containing the data matching the supplied compare data is returned. CAM provides high-speed access to data, because CAM employs dedicated comparator circuitry to perform the look-up function typically within a single clock cycle. CAM is also known as associated memory or associative storage, because CAM provides an associative array in hardware.

Figure 1:
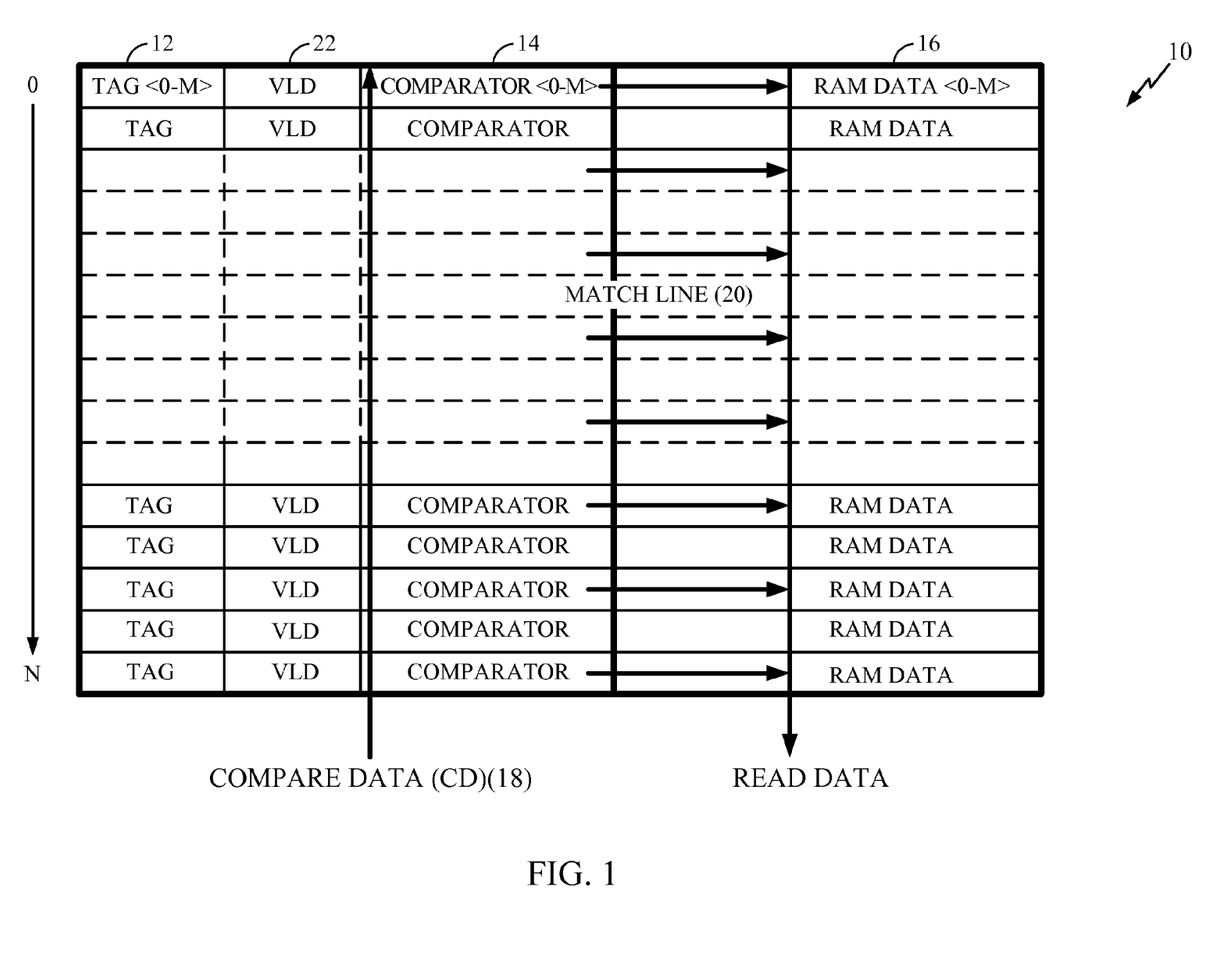
FIG. 1 is a block diagram of an exemplary content-addressable memory (CAM)

FIG. 1 illustrates a block diagram of an exemplary CAM 10. The CAM 10 is comprised of an array of multiple entries. The multiple entries comprise one or more tag data fields 12 and one or more corresponding comparators 14 and RAM data fields 16. Each tag data field 12 includes one (1) bit of data or multiple bits of data to form tag data. In the CAM 10 illustrated in FIG. 1, the tag data field 12 is comprised of 0-M bits to form a tag data word M+1 bits in length. A 0-N-sized array of N+1 physical registers, each comprising a tag data field 12 and a corresponding comparator 14 and RAM data field 16, is provided to provide multiple tag data entries in the CAM 10. A separate comparator circuit is provided in the comparator 14 for each bit in the tag data field 12. When a read function in the CAM 10 is performed, compare data 18 is provided and input into each comparator 14 to compare the compare data 18 against the tag data stored in each tag data field 12. For each compare data 18 that matches the tag data in any tag data field 12, the corresponding comparator 14 generates a signal indicating a match on a corresponding match line 20. Because there are typically multiple copies of the same tag data contained in different tag data fields 12 in the CAM 10, the correct tag data field 12 is marked by a valid bit (VLD) 22.

Either static logic-based comparators ("static-based") or dynamic-based comparators can be employed in CAMs. In a dynamic-based comparator, a dynamic comparator circuit is provided for each bit of tag data. A dynamic comparator circuit employs two pairs of transistors that implement a pulldown path on a match line. A mismatch between a bit of tag data and a corresponding bit of compare data in any of the dynamic comparator circuits activates a pulldown path on the match line to ground. A match between all bits of tag data and all bits of corresponding compare data decouples the match line from ground. Dynamic comparator circuits are generally faster than static-based comparator circuits, because they evaluate by turning on a transistor to discharge an already precharged node. Static-based comparators use complementary metal oxide semiconductor (CMOS) logic where state transitions are dependent upon turning off a transistor while turning on another and are typically slower than dynamic-based comparator circuits. However, dynamic-based comparator circuits consume more power than static-based comparator circuits. Static circuits consume dynamic power when the circuit's input change causes a corresponding output change, while dynamic circuits consume dynamic power every clock cycle due to the precharge phase even when there is no input or output switching activity.

Increased power dissipation due to unnecessary switching of comparator circuits for invalid tag data may be particularly undesirable for CAMs included in battery-powered electronic devices. Increased power dissipation results in quicker battery drain and shorter battery life. It may therefore be desirable to employ static-based comparator circuits in a CAM to reduce power consumption.

SUMMARY OF THE DISCLOSURE

Embodiments disclosed in the detailed description include comparators and related circuits and methods. The comparator receives as input at least one validity indicator indicative of the validity of one or more bits of data to be compared against one or more bits of corresponding compare data. A static-based comparator is provided and configured to selectively switch at least one comparator output coupled to a match line in response to a comparison of the data to compare data and the at least one validity indicator. If the validity indicator indicates valid data, the static-based comparator switches to drive a comparator output indicating either a match or mismatch between the data and corresponding compare data. If the validity indicator indicates invalid data, the static-based comparator provides a mismatch on a comparator output without dissipating power switching regardless of whether or not there is a match between the data and corresponding compare data. In this manner, the static-based comparator is configured to not dissipate power switching the comparator output for data marked invalid in response to a change in compare data. By providing a static-based comparator that is configured to not dissipate power switching a comparator output when data is marked invalid, a power savings can be realized with minimal or no performance degradation to a circuit and/or its critical paths.

In disclosed embodiments, the static-based comparators may be employed in a content-addressable memory (CAMs) for accessing tag data stored in the CAMs. The CAM includes a static logic-based ("static-based") comparator for each bit of tag data in the CAM. A validity indicator is also provided in the CAM indicating whether a given tag data is valid. A data look-up is performed in the CAM by changing the compare data provided to the CAM. Each static-based comparator in the CAM is configured to selectively switch a comparator output in response to a comparison of corresponding tag data with the compare data, and the validity indicator for the tag data. In embodiments disclosed in the detailed description, the static-based comparator is comprised of a comparator circuit that includes complementary metal-oxide semiconductor (CMOS) gates comprised of a complementary pair of pass-gates having a common comparator output. The comparator circuit is configured to provide the same logical value on the inputs of both pass-gates when corresponding tag data is marked invalid to prevent switching of the comparator outputs in response to a change in compare data. Further, a plurality of static-based comparators are provided for each bit of tag data to accommodate a plurality of either read ports, write ports, or both in a CAM.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include comparators and related circuits and methods. The comparator receives as input at least one validity indicator indicative of the validity of one or more bits of data to be compared against one or more bits of corresponding compare data. A static-based comparator is provided and configured to selectively switch at least one comparator output coupled to a match line in response to a comparison of the data to compare data and the at least one validity indicator. If the validity indicator indicates valid data, the static-based comparator switches to drive a comparator output indicating either a match or mismatch between the data and corresponding compare data. If the validity indicator indicates invalid data, the static-based comparator provides a mismatch on a comparator output without dissipating power switching regardless of whether or not there is a match between the data and corresponding compare data. In this manner, the static-based comparator is configured to not dissipate power switching the comparator output for data marked invalid in response to a change in compare data. By providing a static-based comparator that is configured to not dissipate power switching a comparator output when the data is marked invalid, a power savings can be realized with minimal or no performance degradation to a circuit and/or its critical paths.

In disclosed embodiments, the static-based comparators may be employed in a content-addressable memory (CAMs) for accessing tag data stored in the CAMs. The CAM includes a static logic-based ("static-based") comparator for each bit of tag data in the CAM. A validity indicator is also provided in the CAM indicating whether a given tag data is valid. A data look-up is performed in the CAM by changing the compare data provided to the CAM. Each static-based comparator in the CAM is configured to switch a comparator output in response to a comparison of corresponding tag data with the compare data, and the validity indicator for the tag data.

Figure 2:
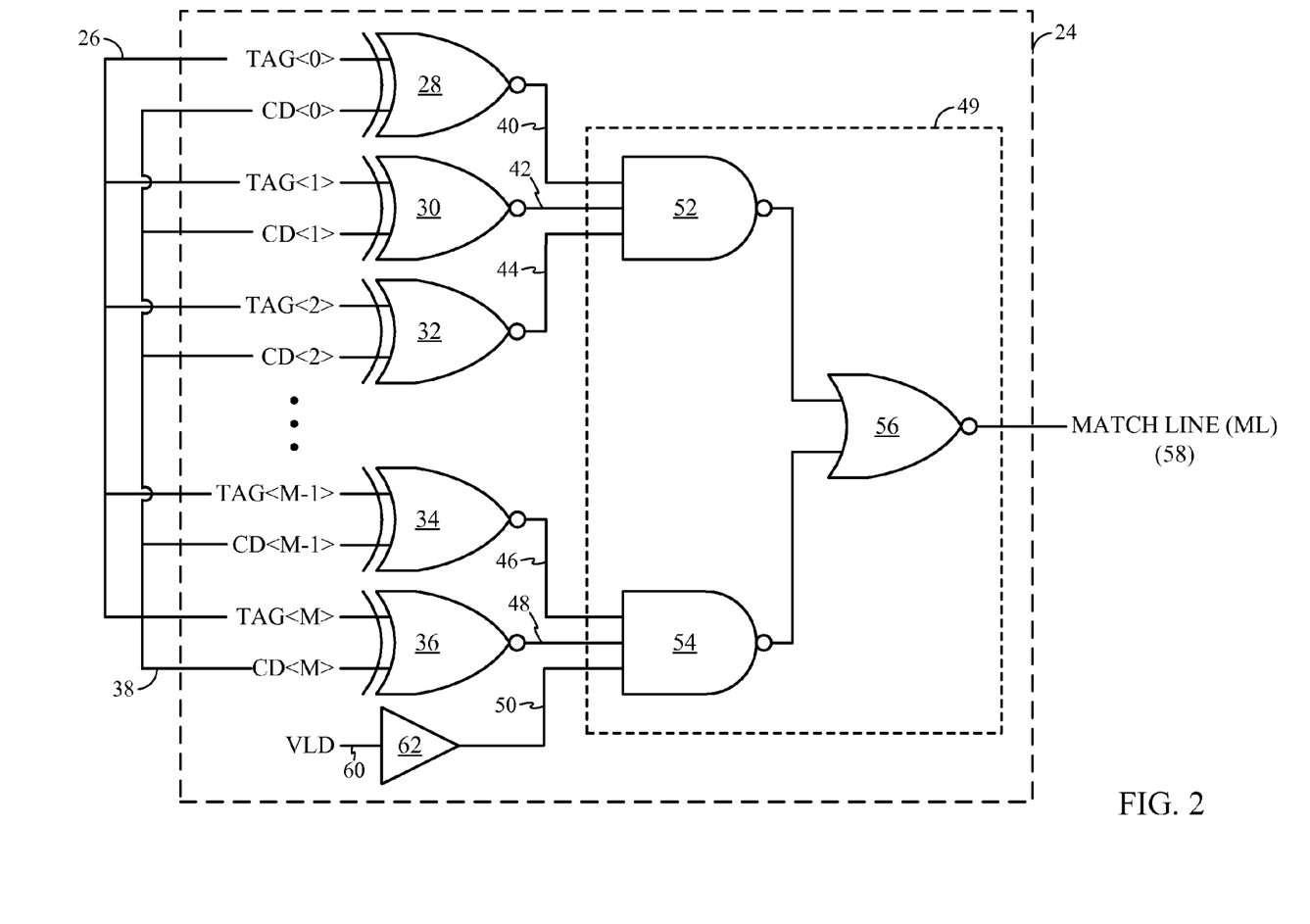
FIG. 2 is a gate diagram of an exemplary static logic-based ("static-based") comparator circuit for a CAM.
Figure 3:
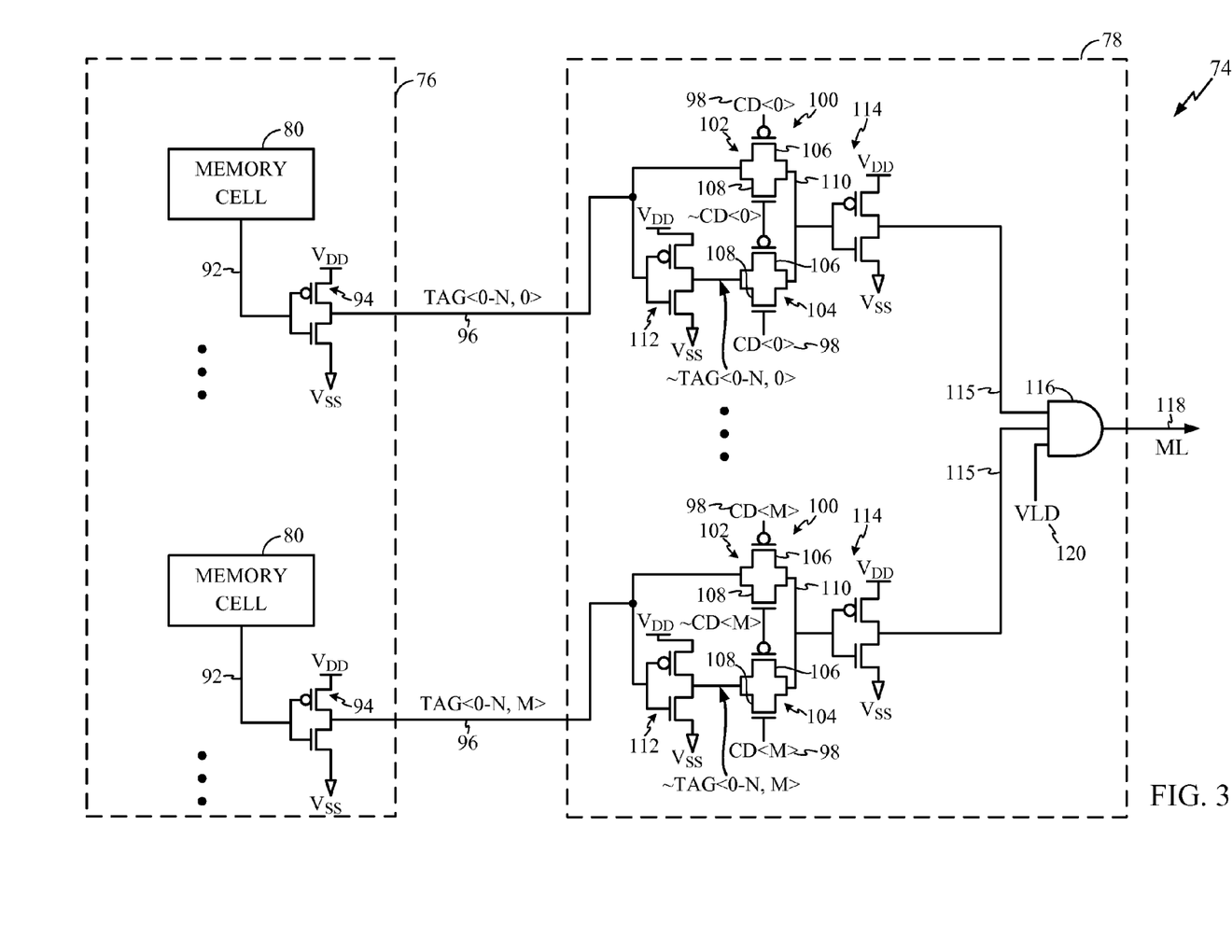
FIG. 3 is a circuit diagram from an exemplary CAM employing static-based comparators.

Before discussing CAM embodiments that employ static-based comparators that do not dissipate power switching a comparator output for invalid tag data, an example of CAM that dissipates power switching a comparator output for invalid tag data is first discussed. FIGS. 2 and 3 illustrate such examples. FIG. 2 is a gate diagram of a static-based comparator 24 for one tag data field in a CAM. As illustrated in FIG. 2, each bit from a tag data field 26 comprised of M+1 bits is input into dedicated exclusive NOR (XNOR) gates 28, 30, 32, 34, 36. The other input into each XNOR gate 28, 30, 32, 34, 36 is a corresponding bit from compare data 38. If a given bit of a tag data field 26 matches a corresponding bit of the compare data 38, a logical high ("1") is output from the XNOR gates 28, 30, 32, 34, 36 to output lines 40, 42, 44, 46, 48. Signals on the output lines 40, 42, 44, 46, 48 from the XNOR gates 28, 30, 32, 34, 36 are combined in combining logic 49. In the illustrated example, the combining logic 49 comprises one or more NAND gates 52, 54 receiving the output signals 40, 42, 44, 46, 48 and generating output signals which are then NOR'ed together via a NOR gate 56 to provide a match line output 58 coupled to a match line. If all bits of the tag data field 26 match all corresponding bits of the compare data 38, the match line output 58 will be generated as a logical high ("1") to indicate a match. The match line output 58 is additionally gated by a validity indicator provided in the form of a valid data (VLD) line 60, which is input into a buffer 62 before being combined with one or more of the output signals 40, 42, 44, 46, 48. If the VLD line 60 indicates invalid data, the match line output 58 will be generated to indicate a mismatch regardless of whether the tag data in the tag data field 26 matches the compare data 38.

While the static-based comparator 24 in FIG. 2 provides a power savings over a dynamic-based comparator, the power savings may be diminished by switching that occurs in the XNOR gates 28, 30, 32, 34, 36 and the NAND gate 52. Even if the tag data in the tag data field 26 input into the static-based comparator 24 is not valid, the XNOR gates 28, 30, 32, 34, 36 and the NAND gate 52 will still switch to perform a comparison to the compare data 38 with each change of the compare data 38. This is further illustrated by an exemplary CAM 74 illustrated in FIG. 3. The CAM 74 in FIG. 3 is illustrated as a circuit diagram. The CAM 74 includes memory 76 that is coupled to static-based comparators 78. A static-based comparator is a comparator employed in static logic that does not use a clock signal to evaluate the combinational logic in the comparator. The memory 76 includes one or more memory cells referred to generally as element 80. Each memory cell 80 is configured to store one bit of tag data. Tag data is data stored in the CAM 74 which is compared against search or compare data (CD) 98. When reading data from the memory cells 80, the read data is asserted on drive lines 92 and fed to static CMOS inverters 94 ("inverters 94").

The output of the inverters 94 provides tag data output 96. The tag data output 96 is labeled TAG<0-N, 0> through TAG<0-N, M>, wherein M and N are zero or any whole number greater than zero. This notation signifies that M+1 memory cells 80 (i.e., 0-M) is provided to provide tag data of M+1 bits in length in the CAM 74. This notation also signifies that an N+1 array of tag data (i.e., 0-N) each comprised of M+1 bits in length is provided in the CAM 74. Thus, although two memory cells 80 are shown in FIG. 3, it is understood that one or more any number of memory cells 80 is provided up to "M+1" memory cells 80 to form either a bit or word of tag data. An array of any number of memory cells 80 can be provided to provide an array of tag data.

During a look-up in the CAM 74, the tag data read from the memory cells 80 is provided on the tag data outputs 96 and provided to the comparators 78 to be compared with compare data 98. Compare data 98 is simply search data provided to the comparators 78 to compare against tag data as part of a look-up operation in a CAM. The compare data 98 is input into and shared between all comparators 78 in the CAM 74. The compare data 98 is comprised of the same number of bits as the number of bits of the tag data (i.e., M+1). Each bit of the tag data output 96 and the corresponding bit of compare data 98 are input into a dedicated static-based comparator circuit 100. The static-based comparator circuit 100 is comprised of CMOS gates comprising a complementary pair of first and second pass-gates 102, 104, each comprised of a P-channel MOS and N-channel MOS transistor 106, 108 that drives a common comparator output 110 to form an exclusive NOR (XNOR) gate. The comparator output 110 is the output resulting from any switching of the first and second pass-gates 102, 104. The tag data output 96 is input via a first signal into the first pass-gate 102. An inverter 112 provides a second signal dependent on the first signal to the second pass-gate 104, which in this example is the complement of the tag data output 96.

When the logical values of the tag data output 96 and the corresponding bit of compare data 98 are the same, the first pass-gate 102 (if logical low ("0")) or the second pass-gate 104 (if logical high ("1")) switches states and passes the tag data output 96 to drive the comparator output 110 low ("0") indicating a match. However, when the tag data output 96 and the corresponding bit of compare data 98 do not match, the static-based comparator circuit 100 drives the comparator output 110 high ("1") to indicate a mismatch. Thus, the static-based comparator circuit 100 forms an exclusive OR (XOR) gate in this example. In either case, whether a match or mismatch exists between the tag data output 96 and a corresponding bit of compare data 98, either the first or second pass-gates 102, 104 switch to drive the comparator output 110 to indicate either a match or mismatch regardless of whether the corresponding tag data is valid or not. Thus, the comparator circuit 100 in the CAM 74 in FIG. 3 dissipates switching power performing comparisons between the tag data output 96 and corresponding bits of compare data 98 for each change in the compare data 98, even when the tag data is marked invalid.

The comparator output 110 is passed through one or more additional logic gates, such as an inverter 114 to convert the XOR to an XNOR gate, to provide additional outputs 115 before finally reaching a combining gate 116. The combining gate 116 is an AND gate in this example and combines the comparator outputs 110 from the static-based comparator circuits 100 for all bits of the tag data. If all the bits of tag data match the corresponding bits of compare data 98, a match line (ML) 118 is driven to indicate a match. A validity indicator in the form of a valid data (VLD) line 120 is also provided to the combining gate 116 to gate the output of the ML 118. The VLD line 120 is driven from a value in a valid bit corresponding to the tag data. If the tag data is not valid, the VLD line 120 will be driven to force a mismatch regardless of whether a match actually exists between the tag data outputs 96 and the corresponding bits of compare data 98.

Figure 4:
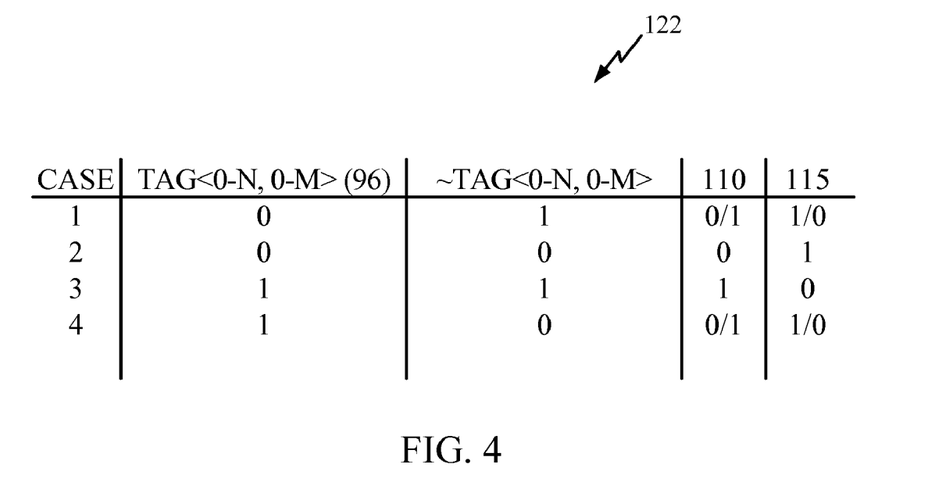
FIG. 4 is a logic table for the static-based comparator in the CAM of FIG. 3 to control switching of a comparator output in response to a comparison of corresponding tag data and a validity indicator indicating the validity of the tag data.

FIG. 4 illustrates a logic table 122 for eliminating switching in the comparator circuits 100 of the CAM 74 of FIG. 3 for tag data marked invalid when the compare data 98 is changed in accordance with one embodiment. The tag data output 96 (TAG<0-N, 0-M>) and the complement of the tag data output 96 (STAG<0-N, 0-M>) are the inputs to the first and second pass-gates 102, 104, respectively. The operation of the CAM 74 in FIG. 3 is illustrated in cases 1 and 4. In these cases, the tag data output 96 (TAG<0-N>) and the complement of the tag data output 96 (~TAG<0-N>) are forced to always be opposite. Thus, one of the pass-gates 102, 104 will switch and dissipate power in response to a change in the compare data 98 regardless of whether the tag data corresponding to the tag data output 96 is marked invalid. However, if the tag data output 96 (TAG<0-N>) and the complement of the tag data output 96 (~TAG<0-N>) were both forced to either logical lows ("0") or logical highs ("1"), as is shown in cases 2 and 3 in logic table 122, the first and second pass-gates 102, 104 would not switch in response to a change in compare data 98. The comparator outputs 110 would always remain either logical low ("0") (for case 2) or logical high ("1") (for case 3). Thus, if the VLD line 120 were used to forced the same logical value between the tag data output 96 (TAG<0-N>) and the complement of the tag data output 96 (~TAG<0-N>), the first and second pass-gates 102, 104 would not switch in response to a change in the compare data 98. As a result, if the logic in the logic table 122 were employed, the first and second pass-gates 102, 104 would not dissipate power switching in response to a change in the compare data 98 when corresponding tag data is marked invalid.

Figure 5:
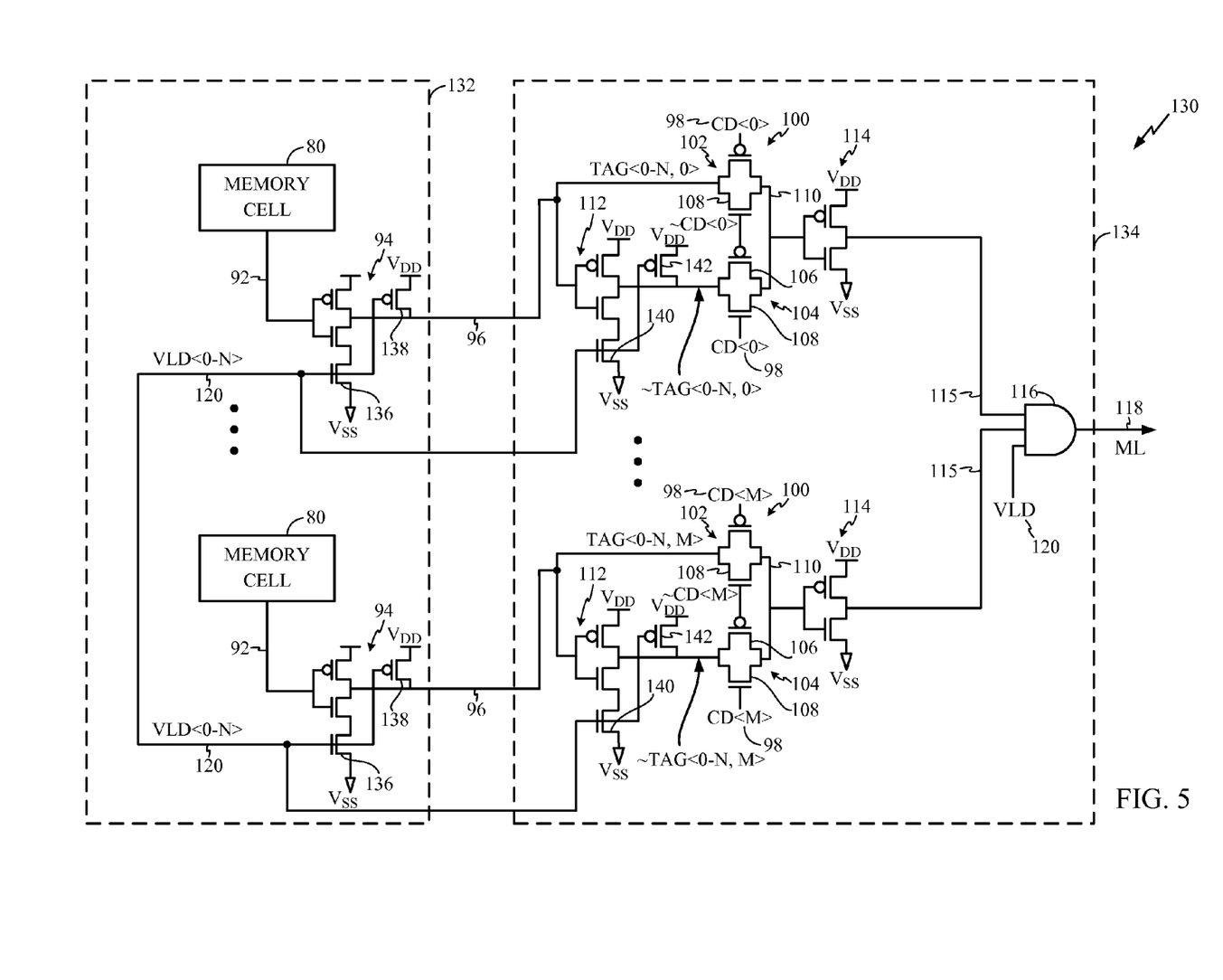
FIG. 5 is a circuit diagram of an exemplary CAM whose static-based comparators operate according to the logic table of FIG. 4.

In this regard, embodiments described herein and throughout the remainder of this application provide circuits, logic, and related methods for a CAM employing a static-based comparator configured to selectively switch a comparator output in response to a comparison of tag data to corresponding compare data and at least one validity indicator indicating the validity of the tag data. FIG. 5 illustrates an example of a CAM 130 that includes comparator circuits configured to not switch a comparator output in response to a change in the compare data 98 when corresponding tag data is marked invalid. The CAM 130 is configured to behave according to case 3 in the logic table 122 of FIG. 4. In this regard, if the VLD line 120 indicates invalid tag data, corresponding comparator circuits do not switch states in response to a change in compare data and thus do not consume power performing comparisons for tag data marked invalid.

As illustrated in FIG. 5, the CAM 130 comprises memory 132 to store one or more bits of tag data and static-based comparators 134 to compare the tag data stored in the memory 132 with compare data 98 input into the CAM 130. In this example, the data stored in the CAM 130 and compared against the compare data 98 is tag data. However, any other type of data may be provided and compared against the compare data 98 as well. The memory 132 and the static-based comparators 134 contain certain common components with the CAM 74 of FIG. 3. These are noted with common element numbers between FIGS. 3 and 5. The previous descriptions of these common components are generally applicable for the CAM 130 of FIG. 5 unless otherwise noted, and thus will not be repeated here.

During a look-up in the CAM 130, the tag data read from the memory cells 80 is asserted on the drive lines 92 and fed into the inverters 94 to provide the tag data output 96. In the CAM 130 of FIG. 5, a control circuit comprised of an NMOS transistor 136 and a PMOS transistor 138 is provided for each inverter 94 to gate the tag data output 96. If the tag data is valid, the VLD line 120 causes the NMOS transistor 136 to couple the inverters 94 to $V_{SS}$ so that the stored value of the memory cell 80 is still asserted onto the tag data output 96. However, if the tag data is not valid, the VLD line 120 causes the PMOS transistor 138 to pull the tag data output 96 from the inverters 94 to $V_{DD}$ or logical high ("1"). Thus, for tag data marked invalid, the signal input into the first pass-gate 102 will be $V_{DD}$ or logical high ("1") regardless of the stored value in the memory cell 80 of a tag data field.

In a similar regard, a control circuit comprised of an NMOS transistor 140 and a PMOS transistor 142 are also provided to each CMOS inverter 112 providing a second signal input into the second pass-gate 104, which in this example is the complement of the tag data output 96. If the tag data is valid, the VLD line 120 ("1") causes the NMOS transistor 140 to couple the inverters 112 to $V_{SS}$ so that the value of the complement of the tag data output 96 is input into the second pass-gate 104. However, if the tag data is marked invalid, the VLD line 120 ("0") causes the PMOS transistor 142 to pull the output of the inverter 112 to $V_{DD}$ or logical high ("1"). Thus, when a tag data is invalid, the VLD line 120 forces both inputs into the first and second pass-gates 102, 104 for each bit of the tag data to $V_{DD}$ or logical high ("1"). As provided in case 3 in the logic table 122 of FIG. 4, when both inputs into the first and second pass-gates 102, 104 are forced to logical highs ("1"), the comparator output 110 will be driven to $V_{DD}$ or logical high ("1") as well. Thus, even if the compare data 98 changes, the input into the first and second pass-gates 102, 104 and the comparator output 110 will remain in the same logical state. As a result, the first and second pass-gates 102, 104 will not switch the state of the comparator outputs 110 and thus will not dissipate power switching states for tag data marked invalid. The logical highs ("1") on the comparator outputs 110 drive the inverter 114, which inverts the comparator outputs 110 to provide additional outputs 115 which are then combined at the combining gate 116, optionally with the VLD line 120, to produce the ML 118.

Thus, for the addition of two transistors in each memory cell 80 and two transistors in each static-based comparator circuit 100 in the CAM 130 of FIG. 5, the dissipation of switching power to compare invalid tag data to compare data 98 is eliminated. This power savings is achieved with either no or minimal performance degradation to the critical paths of the CAM 130, which are the nodes receiving the compare data 98. Power savings was estimated for a 65 namometer (nm), forty-two (42) bit RAM having sixty-four (64) tag data entries each of a five (5) bit length using the CAM 130 as a model. Two functions, an allocate and search/RAM-read, were performed assuming that thirty-two (32) of the tag data entries were marked valid and the remaining thirty-two (32) tag data entries were marked invalid. In both the functions, it was estimated that a 1 milliWatt (mW) power savings may be accomplished over the static-based comparator circuits 100 provided in the CAM 74 of FIG. 3. This equates to an approximate twenty-five percent (25%) power savings for the allocate function, and a six and one-half percent (6.5%) power savings for the search/RAM-read function.

Figure 6:
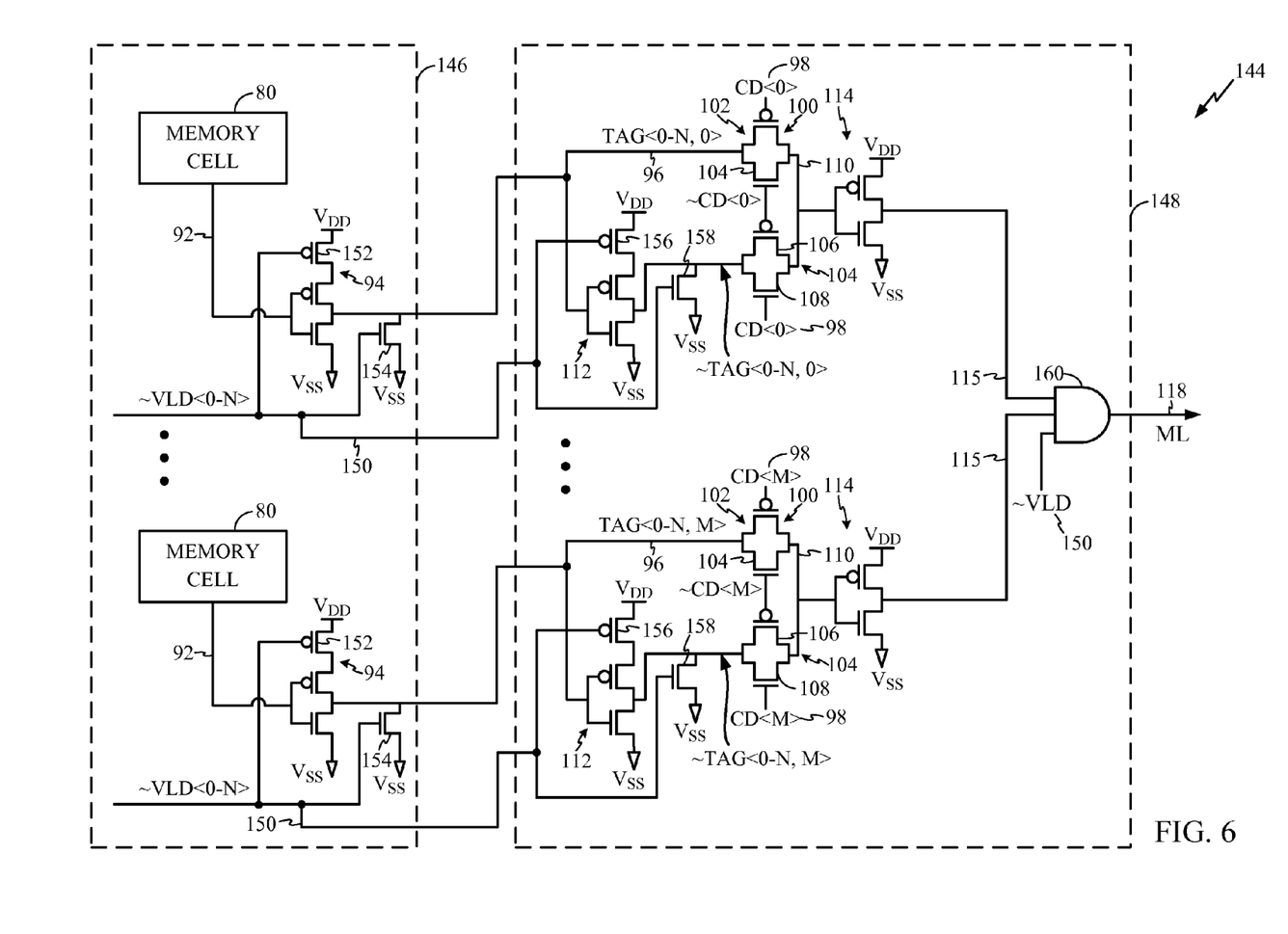
FIG. 6 is a circuit diagram of an alternate exemplary CAM whose static-based comparators operate according to the logic table of FIG. 4.

FIG. 6 illustrates an alternative embodiment of a CAM 144 that also includes static-based comparator circuits 100 configured to not switch comparator outputs when corresponding tag data is marked invalid in response to a change in the compare data 98. The CAM 144 is configured to behave according to case 2 in the logic table 122 in FIG. 4, whereby logical lows ("0") are driven on both inputs to the first and second pass-gates 102, 104 to prevent switching of the comparator outputs 100 when corresponding tag data is marked invalid. This is opposite of the CAM 130 of FIG. 5, wherein logical highs ("1") are driven on both inputs of the first and second pass-gates 102, 104 to prevent switching of the comparator outputs 110 when corresponding tag data is marked invalid. In this regard, a validity indicator in the form of a VLD line 150 is provided that indicates that tag data is invalid when logically high ("1") and valid when logically low ("0"), opposite of the VLD line 120 in the CAM 130 of FIG. 5.

As illustrated in FIG. 6, the CAM 144 comprises memory 146 to store tag data and static-based comparators 148 to compare the tag data output 96 from the memory 146 with corresponding compare data 98. The memory 146 and the static-based comparators 148 contain certain common components with the CAM 130 of FIG. 5 and the CAM 74 of FIG. 3. These are noted with common element numbers between these figures. The previous descriptions of these common components are generally applicable for the CAM 144 of FIG. 6 unless otherwise noted, and thus will not be repeated here.

During a look-up in the CAM 144 of FIG. 6, the read tag data from the memory cells 80 is asserted on the drive lines 92 and fed into the static inverters 94 to provide the tag data output 96. A control circuit comprised of a PMOS transistor 152 and an NMOS transistor 154 is provided for each inverter 94 to gate the tag data output 96. If the tag data is marked valid, the ~VLD line 150 will be logical low ("0") and will cause the PMOS transistor 152 to couple $V_{DD}$ to the inverters 94 so that the stored value of the memory cell 80 is asserted onto the tag data output 96. However, if the tag data is marked invalid, the ~VLD line 150 will be logical high ("1") and will cause the NMOS transistor 154 to pull the tag data output 96 to $V_{SS}$ or logical low (i.e. "0"). Thus, for tag data marked invalid, the input signal into the first pass-gate 102 will be $V_{SS}$ ("0") regardless of the stored value in the memory cell 80 of a tag data field.

In similar regard, a control circuit comprised of a PMOS transistor 156 and an NMOS transistor 158 are also provided in each inverter 112 providing a second signal into the second pass-gate 104, which in this example is the complement of the tag data output 96. If tag data is marked valid, the ~VLD line 150 ("0") causes the PMOS transistor 156 to couple the CMOS inverters 112 to $V_{DD}$ ("1") so that the value of the complement of the tag data output 96 is input into the first pass-gate 102. However, if the tag data is marked invalid, the ~VLD line 150 ("1") causes the NMOS transistor 158 to pull the output of the CMOS inverters 112 to $V_{SS}$ or logical low ("0") to force the input into the second pass-gate 104 to logical low ("0"). Thus, when tag data is marked invalid, the ~VLD line 150 causes both inputs into the first and second pass-gates 102, 104 for each bit of the tag data to $V_{SS}$ or a logical low ("0"). When both inputs into the first and second pass-gates 102, 104 are forced to logical low (i.e., "0"), the comparator output 110 will be driven to $V_{SS}$ or logical low as well. Thus, even if the compare data 98 provided to the first and/or second pass-gates 102, 104 changes, the input into the first and second pass-gates 102, 104 and the comparator outputs 110 remain in the same logical state, which is logical low ("0") in this example. The first and second pass-gates 102, 104 will not switch the states of the comparator outputs 110 and thus will not dissipate power switching states for tag data marked invalid when the compare data 98 changes. The logical low ("0") on the comparator outputs 110 are either provided directly to the combining gate 116, or to drive the inverter 114, which will invert the comparator outputs 110 to provide additional outputs 115 which are then combined at a combining gate 160 (e.g., an AND gate), optionally with the VLD line 150, to produce the ML 118. If the inverters 114 are not provided, the combining gate 160 will be provided of complementary logic.

Thus, just as the case for the CAM 130 in FIG. 5, for the addition of two transistors in each memory cell 80 and two transistors in each static-based comparator circuit 100, the dissipation of switching power to compare invalid tag data to compare data 98 is eliminated in the CAM 144 of FIG. 6. This power savings is achieved with either no or minimal performance degradation to the critical paths of the CAM 144, which are the nodes receiving the compare data 98.

Figure 7:
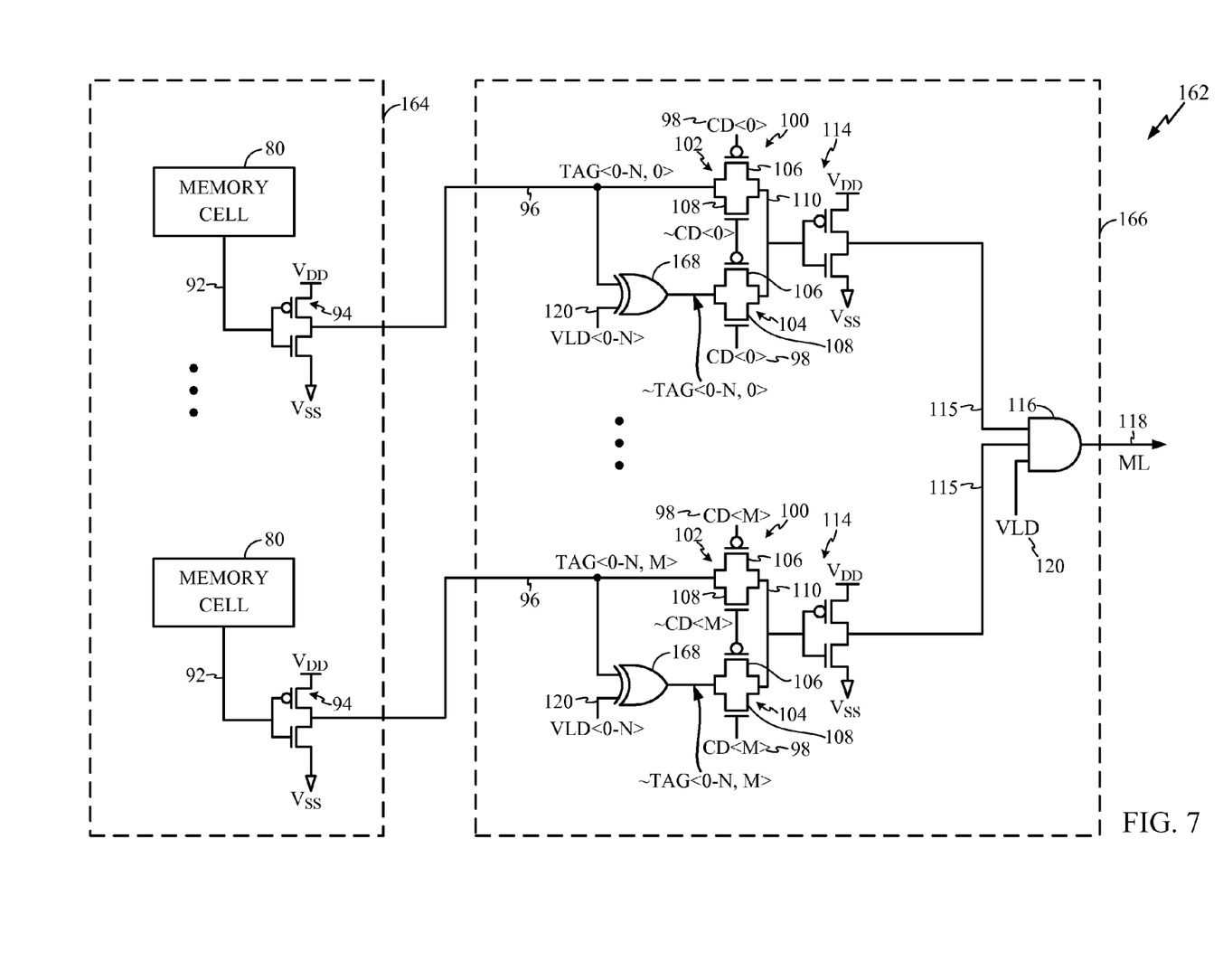
FIG. 7 is a circuit diagram of another alternate exemplary CAM whose static-based comparators operate according to the logic table of FIG. 4.

FIG. 7 illustrates yet another alternative embodiment of a CAM 162 that also includes comparator circuits configured to not switch comparator outputs when corresponding tag data is marked invalid. The CAM 162 is configured to behave according to cases 3 and 4 in the logic table 122 in FIG. 4 and like the CAM 130 of FIG. 5. The same logical values are driven on both inputs to the first and second pass-gates 102, 104 to prevent switching for tag data marked invalid in response to a change in compare data 98. In this regard, the VLD line 120 in FIG. 5 indicates that tag data is valid when logical high ("1") and invalid when logical low ("0"), opposite of the VLD line 150 in the CAM 144 of FIG. 6.

As illustrated in FIG. 7, the CAM 162 comprises memory 164 to store one or more tag data bits and static-based comparators 166 to compare corresponding tag data from the memory 164 with compare data 98. The memory 164 and the static-based comparators 166 contain certain common components with the CAM 74 of FIG. 3. These are noted with common element numbers between FIGS. 3 and 7. The previous descriptions of these common components are generally applicable for the CAM 162 of FIG. 7 unless otherwise noted, and thus will not be repeated here.

During a look-up in the CAM 162, the read tag data from the memory cells 80 is asserted on the drive lines 92 and fed into the inverters 94 to provide the tag data output 96 like provided in the CAM 130 of FIG. 5. However, unlike the CAM 130 of FIG. 5, further gating of the tag data output 96 is not performed before the tag data output 96 is provided to the static-based comparators 166. This is like the CAM 74 of FIG. 3. No additional transistors are required in the memory cells 80. The tag data output 96 (TAG<0-N, 0>) is input directly into the first pass-gate 102. The tag data output is also input into a control circuit comprised of an exclusive OR (XOR) gate 168. The VLD line 150 is also input into the XOR gate 168. The output of the XOR gate 168 is a second signal input into the second pass-gate 104. In this manner, when the VLD line 120 contains a logical low ("0") indicating invalid tag data, the input into both the first and second pass-gates 102, 104 will be the same logical value thus preventing the first and second pass-gates 102, 104 from switching states of the comparator output 110 when the compare data 98 is changed. The tag data output 96, whether logical low ("0") or logical high ("1"), will be input into both the first and second pass-gates 102, 104. Thus, power consumption is not expended switching the first and second pass-gates 102, 104 for tag data marked invalid in response to a change in the compare data 98. However, when the VLD line 120 contains a logical high ("1") indicating valid tag data, the tag data output 96 will be input as a first signal into the first pass-gate 102, and the complement of the tag data output 96 will be input as a second signal into the second pass-gate 104. Thus, switching will occur to compare the tag data to the compare data 98 for normal operation of the first and second pass-gates 102, 104 when the tag data is marked valid.

Figure 8:
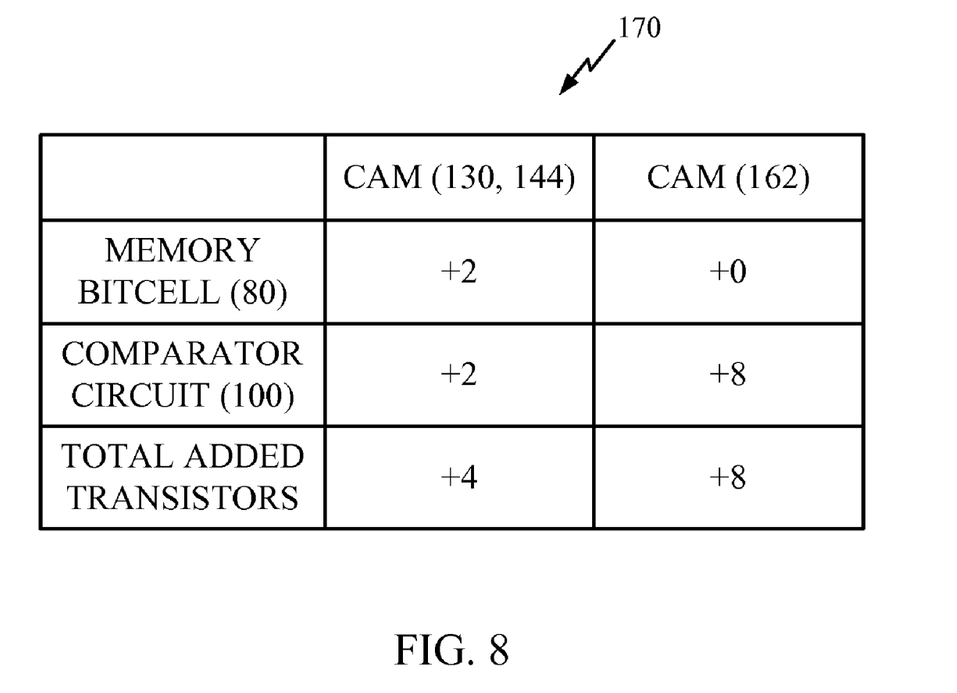
FIG. 8 is a table diagram of gate count for the static-based comparators employed in the CAMs of FIGS. 5-7.

In the CAM 162 of FIG. 7, no additional transistors are added to the memory cells 80 like provided in the memory cells 80 of the CAM 130 in FIG. 5 and the CAM 144 in FIG. 6. However, an XOR gate 168 is added to each of the static-based comparator circuits 100. The XOR gate 168 is comprised of ten transistors. Thus, a net of eight additional transistors are added to the CAM 162 of FIG. 7 versus the CAM 74 of FIG. 3. This is illustrated in table 170 in FIG. 8. As illustrated therein, two additional transistors are added to each the memory cell 80 and static-based comparator circuit 100 for the CAMs 130, 144 over the CAM 74 in FIG. 3 to prevent the static-based comparator circuits 100 from switching when tag data is marked invalid in response to a change in compare data 98. In the CAM 162 of FIG. 7, eight transistors are added over the CAM 74 in FIG. 3, four more than in the CAMs 130, 144 of FIGS. 5 and 6, respectively. All eight additional transistors in the CAM 162 of FIG. 7 are provided in the comparator circuits 100 as opposed to the CAMs 130, 144 of FIGS. 5 and 6, wherein only two additional transistors are added to the static-based comparator circuits 100. If multiple input ports are provided into the CAM 162 thus requiring a static-based comparator 166 for each input port of every bit of tag data, any additional transistors provided in the static-based comparators circuits 100 will be multiplied by the number of input ports.

The CAMs described herein may be employed in microprocessors having microprocessor register files that contain multiple write ports. Multiple write ports accommodate writes from various pipeline stages. The microprocessor register files may also contain multiple read ports. Having multiple read and write ports increases the number of comparator circuits in the CAM. Thus, employing a CAM having static-based comparators configured to not switch comparator outputs when tag data is marked invalid can realize even greater power savings for microprocessors having multiple ports.

Figure 9:
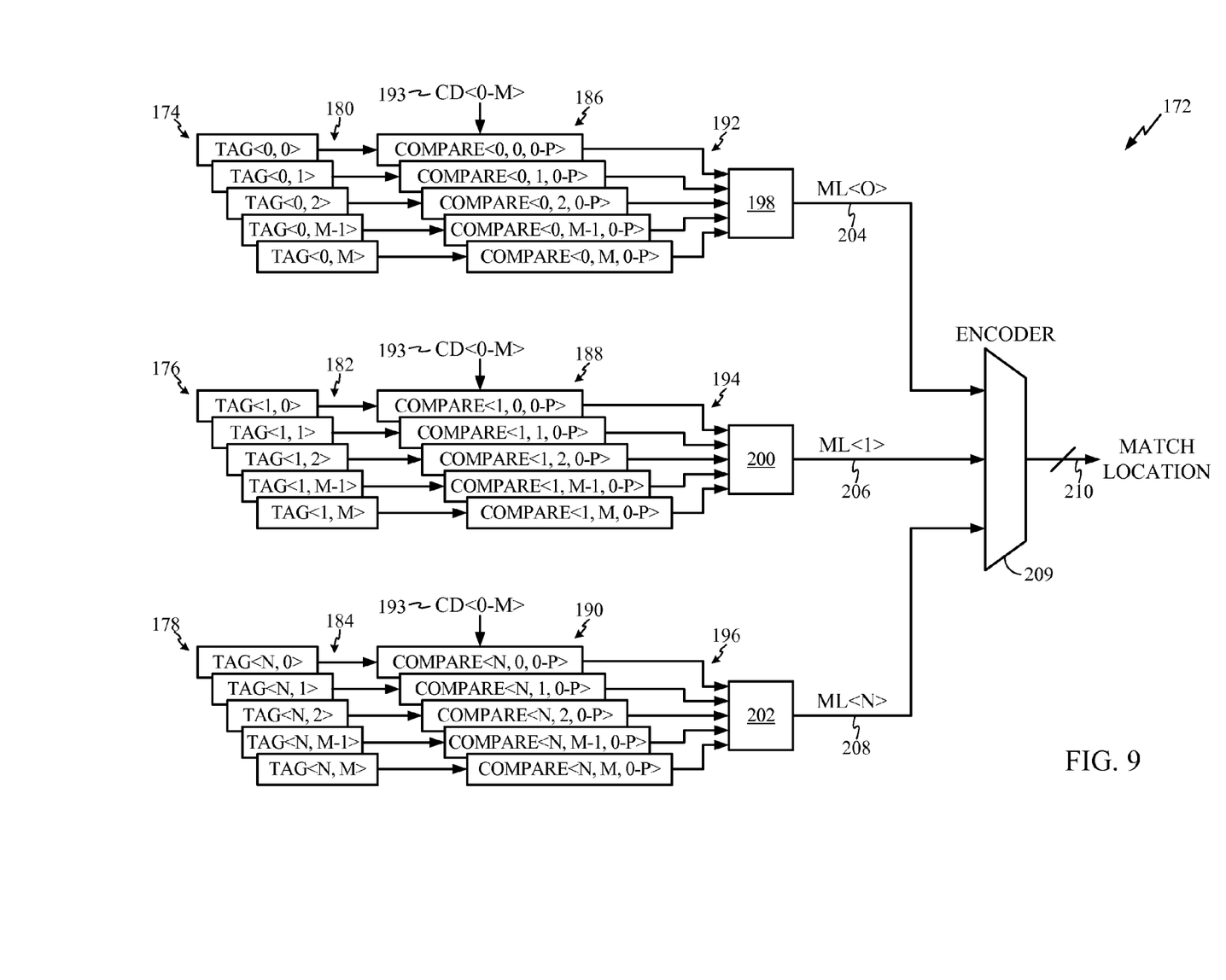
FIG. 9 is a schematic diagram of an exemplary CAM having an array of tag data and employing multiple static-based comparators for each bit of tag data to support multiple input ports.

In this regard, FIG. 9 illustrates a CAM 172 for a microprocessor employing multiple ports. The multiple ports can include multiple read ports, multiple write ports, or both multiple read and write ports. Multiple tag data fields 174, 176, 178 are included in the CAM 172 to form an array of tag data. In this example, "N+1" tag data fields are provided each having "M+1" bits in length, wherein M and N are zero or any whole number greater than zero. Each bit of the tag data stored in the tag data fields 174, 176, 178 is output over tag data output lines 180, 182, 184 and input into static-based comparators 186, 188, 190. A static-based comparator 186, 188, 190 is provided for each tag bit of tag data. Compare data 193 is shared across all of the static-based comparators 186, 188, 190 to compare each bit of tag data to a corresponding bit in the compare data 193. Each static-based comparator 186, 188, 190 is configured to not dissipate power switching their static-based comparator outputs 192, 194, 196 when the compare data 193 changes and the corresponding tag data is marked invalid. Any of the methods and comparator circuits previously described to prevent the static-based comparators 186, 188, 190 from dissipating power switching the comparator outputs 192, 194, 196 for tag data marked invalid is employed in this regard. Because the CAM 172 is employed in a microprocessor having multiple input ports, multiple comparators are provided for each bit of tag data. This is shown by the "0-P" notation in each of the static-based comparators 186, 188, 190, meaning that P+1 comparator circuits are included in the static-based comparators 186, 188, 190 to facilitate P+1 input ports. The comparator outputs 192, 194, 196 from the static-based comparators 186, 188, 190 are input into combining logic 198, 200, 202 to generate a match line (ML) 204, 206, 208. The MLs 204, 206, 208 are input into an optional encoder 209 to provide a match location 210 of the tag data field(s) 174, 176, 178 where a match exists between tag data and the compare data 193.

The CAMs, CAM circuits, and methods disclosed herein can be employed in any circuit, including but not limited to a microprocessor-based circuit or system. The CAMs disclosed herein can be employed in any type of static-based memory, including without limitation, system memory or cache memory. The CAMs, CAM circuits, and methods disclosed herein can be included or employed in any type of electronic device. Examples of such electronic devices include, without limitation, mobile phones, cellular phones, computers, portable computers, desktop computers, personal digital assistants (PDAs), monitors, computer monitors, televisions, tuners, radios, satellite radios, digital music players, portable music players, digital video players, digital video disc (DVD) players, and portable digital video players.

Figure 10:
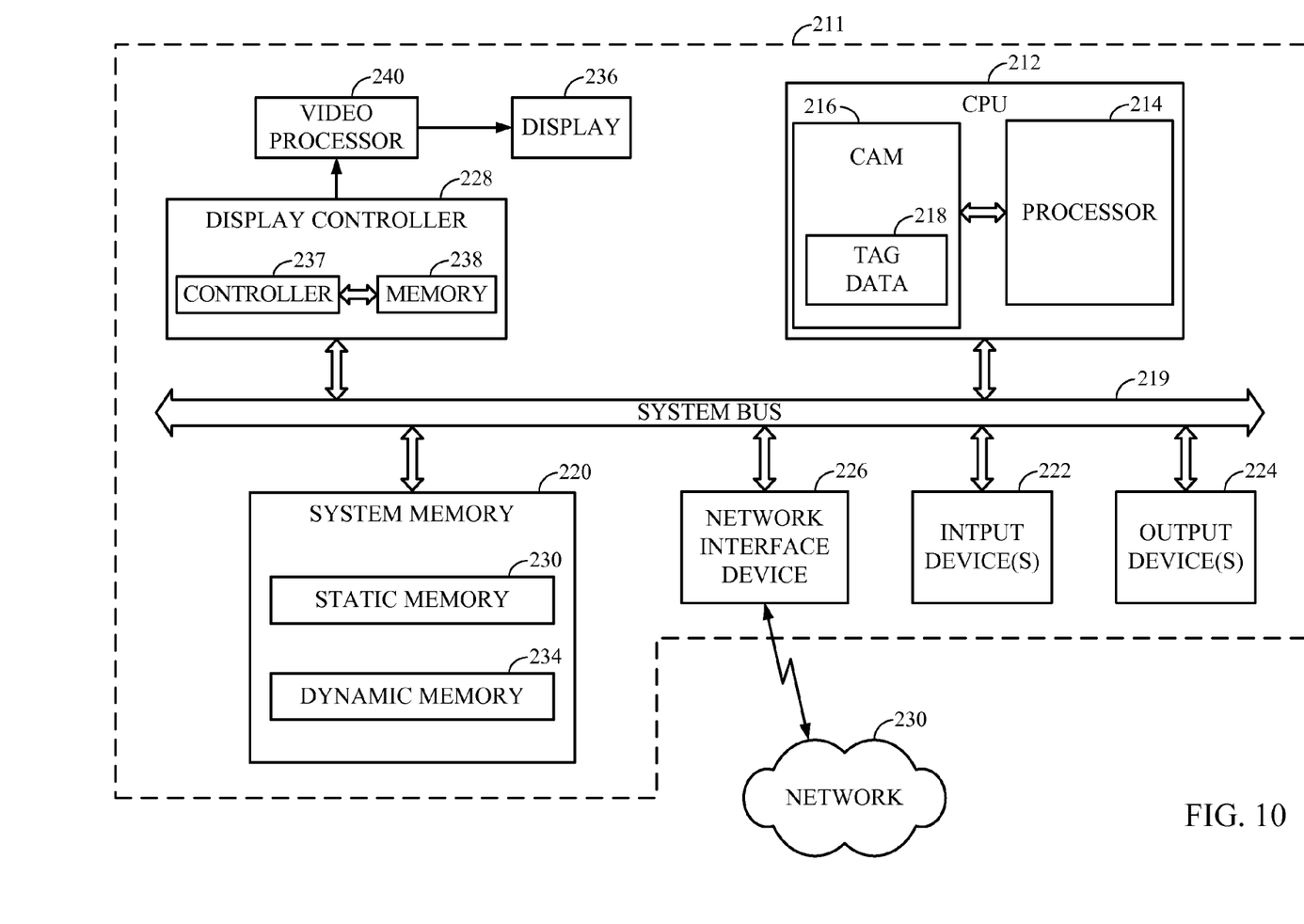
FIG. 10 is a block diagram of an exemplary microprocessor-based system employing a CAM according to embodiments disclosed in the detailed description.

FIG. 10 illustrates an example of processor-based system 211 that can employ a CAM like those previously described. In this example, the processor-based system 211 includes a central processing unit (CPU) 212 that includes a microprocessor 214. The microprocessor 214 is configured to communicate with a CAM 216 to write and read data to and from a tag data array 218. The CPU 212 is coupled to the system bus 219, which intercouples the other devices included in the processor-based system 211. As is well known, the CPU 212 communicates with these other devices by exchanging address, control, and data information over the system bus 219. These devices can include any types of devices. As illustrated in FIG. 10, these devices can include system memory 220, one or more input devices 222, one or more output devices 224, a network interface device 226, and a display controller 228, as examples.

The input devices 222 can include any type of input device, including but not limited to input keys, switches, voice processors, etc. The output devices 224 can include any type of output device, including but not limited to audio, video, other visual indicators, etc. The network interface device 226 can be any device configured to allow exchange of data to and from a network 230. The network 230 can be any type of network, including but not limited to a wired or wireless network, private or public network, a local area network (LAN), a wide local area network (WLAN), and the Internet. The network interface device 226 can support any type of communication protocol desired. The CPU 212 can access the system memory 220 over the system bus 219. The system memory 220 can include static memory 232 and/or dynamic memory 234.

The CPU 212 can also access the display controller 228 over the system bus 219 to control information sent to a display 236. The display controller 228 can include a memory controller 237 and memory 238 to store data to be sent to the display 236 in response to communications with the CPU 212. The display controller 228 sends information to the display 236 to be displayed via a video processor 240, which processes the information to be displayed into a format suitable for the display 236. The display 236 can include any type of display, including but not limited to a cathode ray tube (CRT), a liquid crystal display (LCD), a plasma display, etc.

Those of skill in the art would further appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may store and compare any type of data, including but not limited to tag data, and may be implemented or performed with any signal levels to provide logical true and logical false. Logical true can be represented as a logical high ("1", $V_{DD}$) and logical false as a logical low ("0", $V_{SS}$), or vice versa. The various illustrative logical blocks, modules, and circuits described in connection with the embodiments disclosed herein can also be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

It is noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A content addressable memory comprising:
   a match line;
   a compare data line;
   a valid data line;
   a memory cell to store a tag data bit;
   a first inverter having an input connected to the memory cell, and having an output;
   a first pass gate having an input connected to the output of the first inverter, coupled to the compare data line, and having an output;
   a second inverter having an input connected to the output of the first inverter, and having an output;
   a second pass gate having an input connected to the output of the second inverter, coupled to the compare data line, and having an output;
   a third inverter having an input connected to the outputs of the first and second pass gates, and having an output;
   a gate to drive the match line, and having an input connected to the output of the third inverter;
   a first P-channel transistor connected to the valid data line and the first pass gate to pull up high the input of the first pass gate in response to the valid data line going low;
   a second P-channel transistor connected to the valid data line and the second pass gate to pull up high the input of the second pass gate in response to the valid data line going low.

2. The content addressable memory as set forth in claim 1, having a voltage Vss, further comprising:
   a first N-channel transistor connected to the valid data line and the first inverter to connect the first inverter to Vss only when the valid data line goes high;
   a second N-channel transistor connected to the valid data line and the second inverter to connect the second inverter to Vss only when the valid data line goes high.

3. A content addressable memory comprising:
   a match line;
   a compare data line;
   a complement valid data line;
   a memory cell to store a tag data bit;
   a first inverter having an input connected to the memory cell, and having an output;
   a first pass gate having an input connected to the output of the first inverter, coupled to the compare data line, and having an output;
   a second inverter having an input connected to the output of the first inverter, and having an output;
   a second pass gate having an input connected to the output of the second inverter, coupled to the compare data line, and having an output;
   a third inverter having an input connected to the outputs of the first and second pass gates, and having an output;
   a gate to drive the match line, and having an input connected to the output of the third inverter;
   a first N-channel transistor connected to the complement valid data line and the first pass gate to pull down low the input of the first pass gate in response to the complement valid data line going high;
   a second N-channel transistor connected to the complement valid data line and the second pass gate to pull down low the input of the second pass gate in response to the complement valid data line going high.

4. The content addressable memory as set forth in claim 3, having a voltage Vdd, further comprising:
   a first P-channel transistor connected to the complement valid data line and the first inverter to connect the first inverter to Vdd only when the complement valid data line goes low;
   a second P-channel transistor connected to the complement valid data line and the second inverter to connect the second inverter to Vdd only when the complement valid data line goes low.

5. A content addressable memory comprising:
   a match line;
   a compare data line;
   a valid data line;
   a memory cell to store a tag data bit;
   a first inverter having an input connected to the memory cell, and having an output;
   a first pass gate having an input connected to the output of the first inverter, coupled to the compare data line, and having an output;
   an exclusive OR gate having a first input connected to the output of the first inverter, a second input connected to valid data line, and having an output;
   a second pass gate having an input connected to the output of the exclusive OR gate, coupled to the compare data line, and having an output;
   a second inverter having an input connected to the outputs of the first and second pass gates, and having an output;
   a gate to drive the match line, and having an input connected to the output of the second inverter.

6. A content addressable memory comprising:
   a match line;
   a compare data line;
   a valid data line;
   a memory cell to store a tag data bit;
   a first inverter having an input connected to the memory cell, and having an output;
   a first pass gate having an input connected to the output of the first inverter, coupled to the compare data line, and having an output;
   a second inverter having an input connected to the output of the first inverter, and having an output;
   a second pass gate having an input connected to the output of the second inverter, coupled to the compare data line, and having an output;
   a third inverter having an input connected to the outputs of the first and second pass gates, and having an output;
   means for driving the match line in response to the output of the third inverter;
   means for pulling up high the input of the first pass gate in response to the valid data line going low;
   means for pulling up high the input of the second pass gate in response to the valid data line going low.

7. The content addressable memory as set forth in claim 6, having a voltage Vss, further comprising:
   means for connecting the first inverter to Vss only when the valid data line goes high;
   means for connecting the second inverter to Vss only when the valid data line goes high.

8. A content addressable memory comprising:
   a match line;
   a compare data line;
   a complement valid data line;
   a memory cell to store a tag data bit;
   a first inverter having an input connected to the memory cell, and having an output;
   a first pass gate having an input connected to the output of the first inverter, coupled to the compare data line, and having an output;

a second inverter having an input connected to the output of the first inverter, and having an output;
a second pass gate having input connected to the output of the second inverter, coupled to the compare data line, and having an output;
a third inverter having an input connected to the outputs of the first and second pass gates, and having an output;
a gate to drive the match line, and having an input connected to the output of the third inverter;
means for pulling down low the input of the first pass gate in response to the complement valid data line going high;
means for pulling down low the input of the second pass gate in response to the complement valid data line going high.

9. The content addressable memory as set forth in claim 8, having a voltage Vdd, further comprising:
means for connecting the first inverter to Vdd only when the complement valid data line goes low;
means for connecting the second inverter to Vdd only when the complement valid data line goes low.

10. A content addressable memory comprising:
a match line;
a compare data line;
a valid data line;
a memory cell to store a tag data bit;
a first inverter having an input connected to the memory cell, and having an output;
a first pass gate having an input connected to the output of the first inverter, coupled to the compare data line, and having an output;
a second pass gate having an input, coupled to the compare data line, and having an output;
a second inverter having an input connected to the outputs of the first and second pass gates, and having an output;
a gate to drive the match line, and having an input connected to the output of the second inverter;
means for driving the input of the second pass gate high only if the output of the first inverter is high and the valid data line is low, or only if the output of the first inverter is low and the valid data line is high.

11. A method to match a tag data bit with a compare data bit with a compare circuit, the compare circuit comprising:
a match line;
a compare data line;
a valid data line;
a memory cell to store a tag data bit;
a first inverter having an input connected to the memory cell, and having an output;
a first pass gate having an input connected to the output of the first inverter, coupled to the compare data line, and having an output;
a second inverter having an input connected to the output of the first inverter, and having an output;
a second pass gate having an input connected to the output of the second inverter, coupled to the compare data line, and having an output;
a third inverter having an input connected to the outputs of the first and second pass gates, and having an output;
a gate to drive the match line, and having an input connected to the output of the third inverter;
the method comprising:
pulling up high the input of the first pass gate in response to the valid data line going low;
pulling up high the input of the second pass gate in response to the valid data line going low.

12. The method as set forth in claim 11, further comprising:
connecting the first inverter to Vss only when the valid data line goes high;
connecting the second inverter to Vss only when the valid data line goes high.

13. A method to match a tag data bit with a compare data bit with a compare circuit, the compare circuit comprising:
a match line;
a compare data line;
a valid data line;
a memory cell to store a tag data bit;
a first inverter having an input connected to the memory cell, and having an output;
a first pass gate having an input connected to the output of the first inverter, coupled to the compare data line, and having an output;
a second inverter having an input connected to the output of the first inverter, and having an output;
a second pass gate having an input connected to the output of the second inverter, coupled to the compare data line, and having an output;
a third inverter having an input connected to the outputs of the first and second pass gates, and having an output;
a gate to drive the match line, and having an input connected to the output of the third inverter;
the method comprising:
pulling down low the input of the first pass gate in response to the complement valid data line going high;
pulling down low the input of the second pass gate in response to the complement valid data line going high.

14. The method as set forth in claim 13, further comprising:
connecting the first inverter to Vdd only when the complement valid data line goes low;
connecting the second inverter to Vdd only when the complement valid data line goes low.

15. A method to match a tag data bit with a compare data bit with a compare circuit, the compare circuit comprising:
a match line;
a compare data line;
a valid data line;
a memory cell to store a tag data bit;
a first inverter having an input connected to the memory cell, and having an output;
a first pass gate having an input connected to the output of the first inverter, coupled to the compare data line, and having an output;
a second pass gate having an input, coupled to the compare data line, and having an output;
a second inverter having an input connected to the outputs of the first and second pass gates, and having an output;
a gate to drive the match line, and having an input connected to the output of the second inverter;
the method comprising:
driving the input of the second pass gate high only if the output of the first inverter is high and the valid data line is low, or only if the output of the first inverter is low and the valid data line is high.

* * * * *